(12) United States Patent
Lee et al.

(10) Patent No.: US 8,946,735 B2
(45) Date of Patent: Feb. 3, 2015

(54) PIXEL STRUCTURE OF ELECTROLUMINESCENT DISPLAY PANEL

(71) Applicant: AU Optronics Corp., Hsin-Chu (TW)

(72) Inventors: Meng-Ting Lee, Hsin-Chu (TW); Miao-Tsai Chu, Hsin-Chu (TW)

(73) Assignee: AU Optronics Corp., Science-Based Industrial Park, Hsin-Chu (TW)

( * ) Notice: Subject to any disclaimer, the term of this patent is extended or adjusted under 35 U.S.C. 154(b) by 16 days.

(21) Appl. No.: 13/669,430

(22) Filed: Nov. 5, 2012

(65) Prior Publication Data

US 2013/0140533 A1 Jun. 6, 2013

(30) Foreign Application Priority Data

Dec. 5, 2011 (TW) .............................. 100144727 A
May 17, 2012 (TW) .............................. 101117582 A

(51) Int. Cl.
*H01L 27/32* (2006.01)
(52) U.S. Cl.
CPC ........ *H01L 37/3211* (2013.01); *H01L 27/3213* (2013.01); *H01L 27/3218* (2013.01)
USPC   257/89; 257/40; 257/E51.022; 257/E27.119; 438/35; 438/99
(58) Field of Classification Search
CPC ......................... H01L 27/3216; H01L 27/3218
See application file for complete search history.

(56) References Cited

U.S. PATENT DOCUMENTS

| 2005/0140288 A1* | 6/2005 | Suzuki ......................... 313/506 |
| 2009/0283786 A1 | 11/2009 | Kobayashi |
| 2010/0052524 A1 | 3/2010 | Kinoshita |
| 2010/0133994 A1* | 6/2010 | Song et al. ..................... 313/504 |
| 2010/0283385 A1* | 11/2010 | Maeda et al. .................. 313/504 |
| 2011/0114974 A1* | 5/2011 | Song et al. ..................... 257/89 |

FOREIGN PATENT DOCUMENTS

| CN | 101582440 A | 11/2009 |
| CN | 101661951 A | 3/2010 |

OTHER PUBLICATIONS

Tian, Abstract of "Investigation of Microcavity Effects and Surface Plasmon Polaritons in Organic Electro-Optical Devices", 2010.
Yang, Abstract of "Research and Efficiency Improvement of White Organic Light-Emitting Diodes with Doped Active Layers", 2008.

* cited by examiner

*Primary Examiner* — Julio J Maldonado
*Assistant Examiner* — Molly Reida
(74) *Attorney, Agent, or Firm* — Winston Hsu; Scott Margo

(57) ABSTRACT

A pixel structure of electroluminescent display panel has a first sub-pixel region, a second sub-pixel region and a third sub-pixel region. The pixel structure of electroluminescent display panel includes a first organic light-emitting layer and a second organic light-emitting layer. The first organic light-emitting layer, which includes a first organic light-emitting material, is disposed at least in the first sub-pixel region and the second sub-pixel region. The second organic light-emitting layer, which includes a second organic light-emitting material and a third organic light-emitting material, is disposed at least in the second sub-pixel region and the third sub-pixel region. The first organic light-emitting layer and the second organic light-emitting layer overlap in the second sub-pixel region. The first sub-pixel region and the third sub-pixel region have different cavity lengths.

8 Claims, 11 Drawing Sheets

PIXEL STRUCTURE OF ELECTROLUMINESCENT DISPLAY PANEL

BACKGROUND OF THE INVENTION

1. Field of the Invention

The present invention is related to a pixel structure of an electroluminescent display panel, and more particularly, related to a pixel structure of an electroluminescent display panel that is no need of color filter for displaying image.

2. Description of the Prior Art

Due to its self-luminous, high contrast ratio, compact size, and wide viewing angle properties, electroluminescent display panel e.g. organic light-emitting diode (OLED) display panel has been expected to prevail in the display market of next generation. In conventional full-color electroluminescent display panel, white light organic light-emitting layer is mainly used for generating white light and then color filters are used for filtering the white light to form three different primary color lights, such as red light, green light and blue light, so as to display full-color display image. However, since the white light has a wide spectrum, the filtered red light, green light and blue light from the color filters are not saturated enough, such that the color gamut is not good enough. Besides, the color filters cause about 50% of light loss, thus the power consumption of the electroluminescent display panel is greatly raised.

SUMMARY OF THE INVENTION

It is therefore one of the objective of the present invention to provide a pixel structure of an electroluminescent display panel having good color saturation and with low power consumption.

According to an embodiment of the present invention, a pixel structure of an electroluminescent display panel having a first sub-pixel region, a second sub-pixel region and a third sub-pixel region is provided. The pixel structure of the electroluminescent display panel includes a first anode, a second anode, a third anode, a first organic light-emitting layer, a second organic light-emitting layer, a first cathode, a second cathode and a third cathode. The first anode, the second anode and the third anode are disposed in the first sub-pixel region, the second sub-pixel region and the third sub-pixel region respectively. The first organic light-emitting layer is disposed at least in the first sub-pixel region and the second sub-pixel region, wherein the first organic light-emitting layer includes a first organic light-emitting material. The second organic light-emitting layer is disposed at least in the second sub-pixel region and the third sub-pixel region, wherein the first organic light-emitting layer overlaps the second organic light-emitting layer in the second sub-pixel region, and the second organic light-emitting layer includes a second organic light-emitting material and a third organic light-emitting material. The first cathode, the second cathode and the third cathode are disposed in the first sub-pixel region, the second sub-pixel region and the third sub-pixel region respectively. A first micro cavity is formed between the first anode and the first cathode in the first sub-pixel region, a third micro cavity is formed between the third anode and the third cathode in the third sub-pixel region, and the first micro cavity and the third micro cavity have different cavity lengths.

These and other objectives of the present invention will no doubt become obvious to those of ordinary skill in the art after reading the following detailed description of the preferred embodiment that is illustrated in the various figures and drawings.

DETAILED DESCRIPTION

To provide a better understanding of the present invention to the skilled users in the technology of the present invention, preferred embodiments will be detailed as follows. The preferred embodiments of the present invention are illustrated in the accompanying drawings with numbered elements to elaborate on the contents and effects to be achieved.

Figure 1:
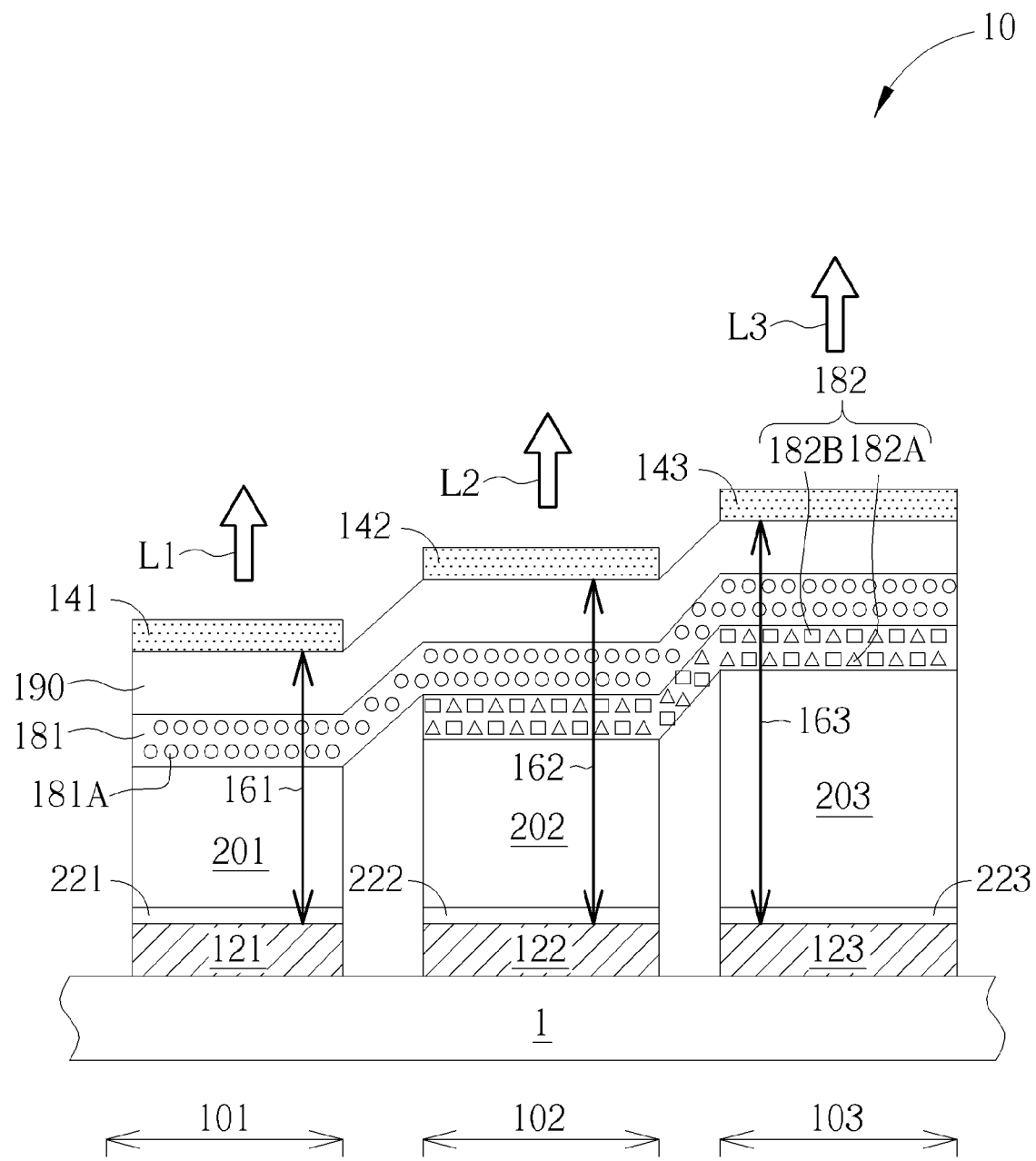
FIG. 1 is a schematic diagram of a pixel structure of an electroluminescent display panel according to a first preferable embodiment of the present invention.

Please refer to FIG. 1. FIG. 1 is a schematic diagram of a pixel structure of an electroluminescent display panel according to a first preferable embodiment of the present invention. As shown in FIG. 1, the pixel structure 10 of the electroluminescent display panel of this embodiment has a first sub-pixel region 101, a second sub-pixel region 102 and a third sub-pixel region 103, or the pixel structure 10 of the electroluminescent display panel of this embodiment is composed of the first sub-pixel region 101, the second sub-pixel region 102 and the third sub-pixel region 103, for displaying different color lights respectively. The first sub-pixel region 101, the second sub-pixel region 102 and the third sub-pixel region 103 may be arranged side by side, wherein the first sub-pixel region 101 is disposed near the second sub-pixel region 102, and the second sub-pixel region 102 is disposed near the third sub-pixel region 103, but not limited thereto.

In this embodiment, the pixel structure 10 of the electroluminescent display panel includes a substrate 1, a first anode 121, a second anode 122, a third anode 123, a first cathode 141, a second cathode 142 and a third cathode 143. The first anode 121 and the first cathode 141 are disposed in the first sub-pixel region 101, and a first micro cavity 161 is formed between the first anode 121 and the first cathode 141 in the first sub-pixel region 101. The second anode 122 and the second cathode 142 are disposed in the second sub-pixel region 102, and a second micro cavity 162 is formed between the second anode 122 and the second cathode 142 in the second sub-pixel region 102. The third anode 123 and the third cathode 143 are disposed in the third sub-pixel region 103, and a third micro cavity 163 is formed between the third anode 123 and the third cathode 143 in the third sub-pixel region 103. In addition, the first micro cavity 161, the second micro cavity 162 and the third micro cavity 163 have different cavity lengths. The electroluminescent display panel of this embodiment is a top emission type electroluminescent display panel, wherein the first cathode 141, the second cathode 142 and the third cathode 143 are transflective electrodes respectively, and the first anode 121, the second anode 122 and the third anode 123 are reflective electrodes respectively. For example, the transflective electrodes may be thin metal electrodes, and the reflective electrodes may be thick metal electrodes, but not limited thereto. In addition, the first cathode 141, the second cathode 142 and the third cathode 143 may be electrically connected to each other and be driven by applying with a common voltage. Alternatively, the first cathode 141, the second cathode 142 and the third cathode 143 may be electrically isolated and be driven by applying with different voltages. The pixel structure 10 of the electroluminescent display panel may further selectively include at least one first transparent electrode layer 221, at least one second transparent electrode layer 222 and at least one third transparent electrode layer 223 respectively disposed in the first sub-pixel region 101, the second sub-pixel region 102 and the third sub-pixel region 103. In this embodiment, the first transparent electrode layer 221, the second transparent electrode layer 222 and the third transparent electrode layer 223 have substantially the same thicknesses, but not limited thereto.

The pixel structure 10 of the electroluminescent display panel of this embodiment further includes a first organic light-emitting layer 181 and a second organic light-emitting layer 182. The first organic light-emitting layer 181 includes a first organic light-emitting material 181A and is disposed in the first sub-pixel region 101, the second sub-pixel region 102 and the third sub-pixel region 103, for generating a first primary color light in the first sub-pixel region 101; the second organic light-emitting layer 182 includes a second organic light-emitting material 182A and a third organic light-emitting material 182B and is disposed in the second sub-pixel region 102 and the third sub-pixel region 103, for generating a second primary color light L2 in the second sub-pixel region 102 and generating a third primary color light L3 in the third sub-pixel region 103. The first organic light-emitting material 181A, the second organic light-emitting material 182A and the third organic light-emitting material 182B are organic light-emitting materials cable of generating different primary color lights. For example, the first organic light-emitting material 181A, the second organic light-emitting material 182A and the third organic light-emitting material 182B are respectively selected from one of the blue light organic light-emitting material, the green light organic light-emitting material and the red light organic light-emitting material, thus the first primary color light L1, the second primary color light L2 and the third primary color light L3 have different wavelength spectrums. For example, the first organic light-emitting material 181A includes a blue light organic light-emitting material, the second organic light-emitting material 182A includes a green light organic light-emitting material, and the third organic light-emitting material 182B includes a red light organic light-emitting material, thus the first primary color light L1, the second primary color light L2 and the third primary color light L3 are blue light, green light and red light respectively, but not limited thereto. In addition, the first organic light-emitting layer 181 and the second organic light-emitting layer 182 are overlapped with each other in the second sub-pixel region 102 and the third sub-pixel region 103. Taking this embodiment as an example, the first organic light-emitting layer 181 is stacked on the second organic light-emitting layer 182, but not limited thereto. The second organic light-emitting layer 182 may be stacked on the first organic light-emitting layer 181 in different examples.

The pixel structure 10 of the electroluminescent display panel of this embodiment may further include at least one first hole transport layer 201, at least one second hole transport layer 202, at least one third hole transport layer 203, and at least one electron transport layer 190. The first hole transport layer 201 is disposed in the first sub-pixel region 101 and between the first anode 121 and the first organic light-emitting layer 181; the second hole transport layer 202 is disposed in the second sub-pixel region 102 and between the second anode 122 and the second organic light-emitting layer 182; the third hole transport layer 203 is disposed in the third sub-pixel region 103 and between the third anode 123 and the second organic light-emitting layer 182. The electron transport layer 190 is disposed in the first sub-pixel region 101, the second sub-pixel region 102 and the third sub-pixel region 103, and is disposed between the cathodes (including the first cathode 141, the second cathode 142 and the third cathode 143) and the first organic light-emitting layer 181. In addition, in order to increase the injection efficiency of holes and electrons, the pixel structure 10 of the electroluminescent display panel may further selectively include at least one electron injection layer (not shown) and at least one hole injection layer (not shown).

In this embodiment, the first organic light-emitting layer 181 and the second organic light-emitting layer 182 may be formed through a dry process, such as an evaporation process, respectively. The second organic light-emitting layer 182 may be a single-layered organic light-emitting layer and may be formed through a co-evaporation process to include the second organic light-emitting material 182A and the third organic light-emitting material 182B at the same time, but not limited thereto. In addition, the second organic light-emitting layer 182 is not limited to a single-layered organic light-emitting layer and may be a composite-layered organic light-emitting layer, which means the second organic light-emitting material and the third organic light-emitting material may be successively evaporated to form the second organic light-emitting layer 182. In another embodiment, the first organic light-emitting layer 181 and the second organic light-emitting layer 182 may be formed through a wet process (solution process), such as a coating process, an inkjet printing process, or a screen printing process, respectively. Furthermore, the first organic light-emitting layer 181 is a structural layer, continuously disposed in the first sub-pixel region 101, the second sub-pixel region 102 and the third sub-pixel region 103. The second organic light-emitting layer 182 is also a structural layer, continuously disposed in the second sub-pixel region 102 and the third sub-pixel region 103. The first organic light-emitting layer 181 generates the first primary color light (blue light) L1 in the first sub-pixel region 101, the second sub-pixel region 102 and the third sub-pixel region 103 when displaying images. However, due to the micro cavity effect, the first primary color light L1 will emit out from the first sub-pixel region 101 but not from the second sub-pixel region 102 and the third sub-pixel region 103. The second organic light-emitting layer 182 generates the second primary color light (green light) L2 and the third primary color light (red light) L3 in the second sub-pixel region 102 and the third sub-pixel region 103, but the second primary color light L2 will emit out only from the second sub-pixel region 102 and will not emit out from the third sub-pixel region 103, while the third primary color light L3 will emit out only from the third sub-pixel region 103 and will not emit out from the second sub-pixel region 102, due to the micro cavity effect. In other words, by making use of the micro cavity effect, each sub-pixel region can produce different primary color lights without using color filters according to the present invention.

In this embodiment, the first micro cavity 161, the second micro cavity 162 and the third micro cavity 163 having different cavity lengths is achieved by making the first hole transport layer 201, the second hole transport layer 202 and the third hole transport layer 203 having different thicknesses. For example, in this embodiment, the first primary color light L1 is blue light, the second primary color light L2 is green light, and the third primary color light L3 is red light, thus the relation of the cavity lengths is as the following: the cavity length of the third micro cavity 163 is greater than the cavity length of the second micro cavity 162, and the cavity length of the second micro cavity 162 is greater than the cavity length of the first micro cavity 161. Therefore, the thickness of the third hole transport layer 203 is greater than the thickness of the second hole transport layer 202 and the thickness of the second hole transport layer 202 is greater than the thickness of the first hole transport layer 201 in this embodiment. In addition, the third hole transport layer 203, the second hole transport layer 202 and the first hole transport layer 201 may have the same carrier mobility, but not limited thereto.

From the above description, since the first organic light-emitting layer 181 is continuously disposed in the first sub-pixel region 101, the second sub-pixel region 102 and the third sub-pixel region 103, fine metal mask (FMM) is not needed in the formation step of the first organic light-emitting layer 181 and only one FMM is used for defining the second organic light-emitting layer 182, so as to fabricate the pixel structure of the electroluminescent display panel that can produce three different primary color lights. In addition, according to the pixel structure 10 of the electroluminescent display panel of this embodiment, the second sub-pixel region 102 and the third sub-pixel region 103 have the common second organic light-emitting layer 182, thus the spacing between the second sub-pixel region 102 and the third sub-pixel region 103 can be reduced, such that the total amount of the sub-pixel regions can be increased while preserving the same resolution, without increasing the total area of the display panel or decreasing the aperture ratio of the sub-pixel region. Furthermore, since color filter is not needed for displaying color image, the power consumption is saved and the life of the first organic light-emitting layer (blue light organic light-emitting layer) 181 can be lengthened.

The pixel structure of the electroluminescent display panel of the present invention is not limited by the aforementioned embodiment, and may have other different preferred embodiments and variant embodiments. To simplify the description, the identical components in each of the following embodiments are marked with identical symbols. For making it easier to compare the difference between the embodiments, the following description will detail the dissimilarities among different embodiments and the identical features will not be redundantly described.

Figure 2:
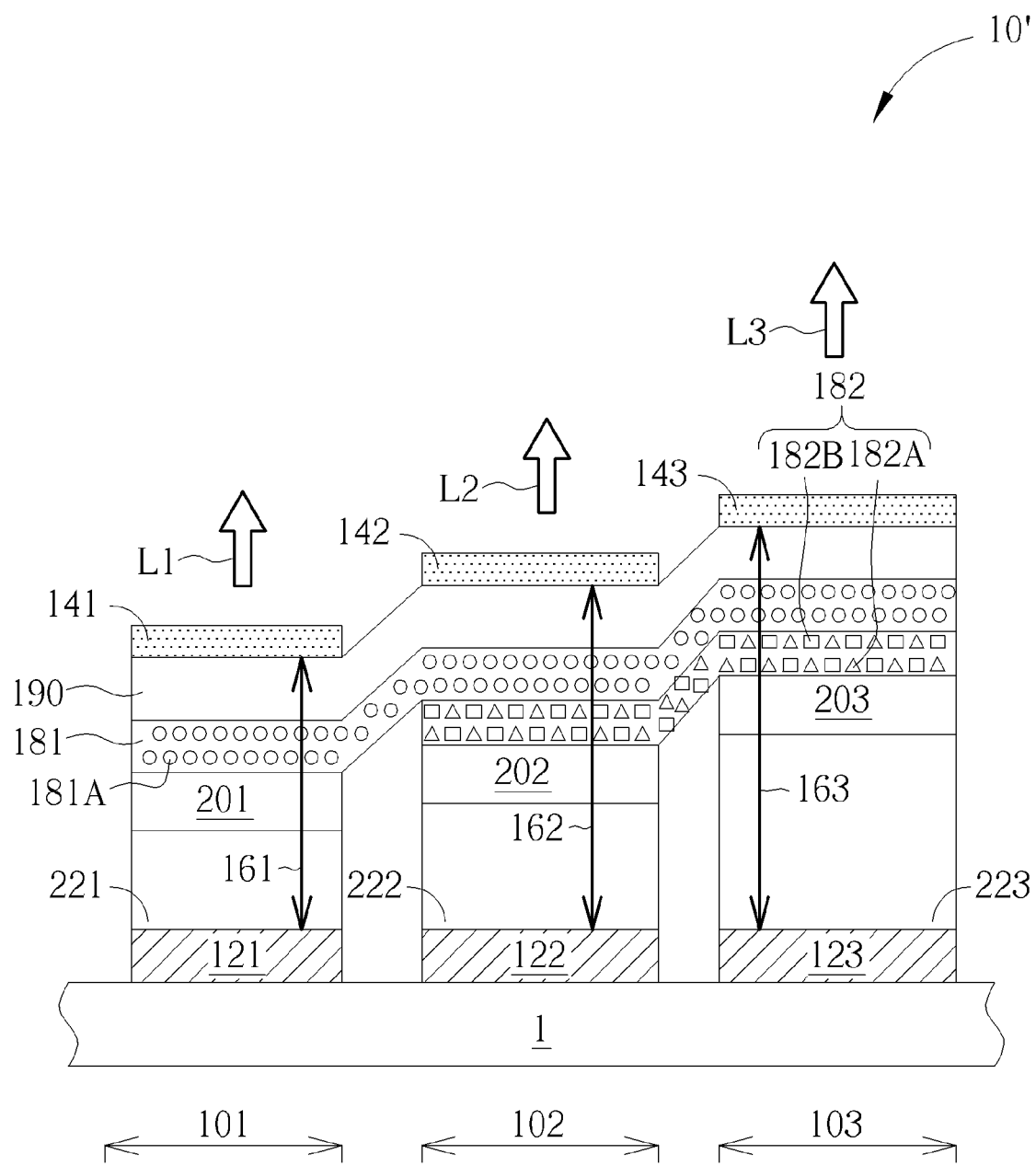
FIG. 2 is a schematic diagram of a pixel structure of an electroluminescent display panel according to a first variant embodiment of the first preferable embodiment of the present invention.

Please refer to FIG. 2. FIG. 2 is a schematic diagram of a pixel structure of an electroluminescent display panel according to a first variant embodiment of the first preferable embodiment of the present invention. As shown in FIG. 2, different from the above-mentioned embodiment, the first transparent electrode layer 221 may be disposed between the first anode 121 and the first hole transport layer 201, the second transparent electrode layer 222 may be disposed between the second anode 122 and the second hole transport layer 202, and the third transparent electrode layer 223 may be disposed between the third anode 123 and the third hole transport layer 203 in the pixel structure 10' of the electroluminescent display panel. In this embodiment, the first hole transport layer 201, the second hole transport layer 202 and the third hole transport layer 203 have substantially the same thicknesses, whereas the first transparent electrode layer 221, the second transparent electrode layer 222 and the third transparent electrode layer 223 have different thicknesses to render the first micro cavity 161, the second micro cavity 162 and the third micro cavity 163 having different cavity lengths.

Figure 3:
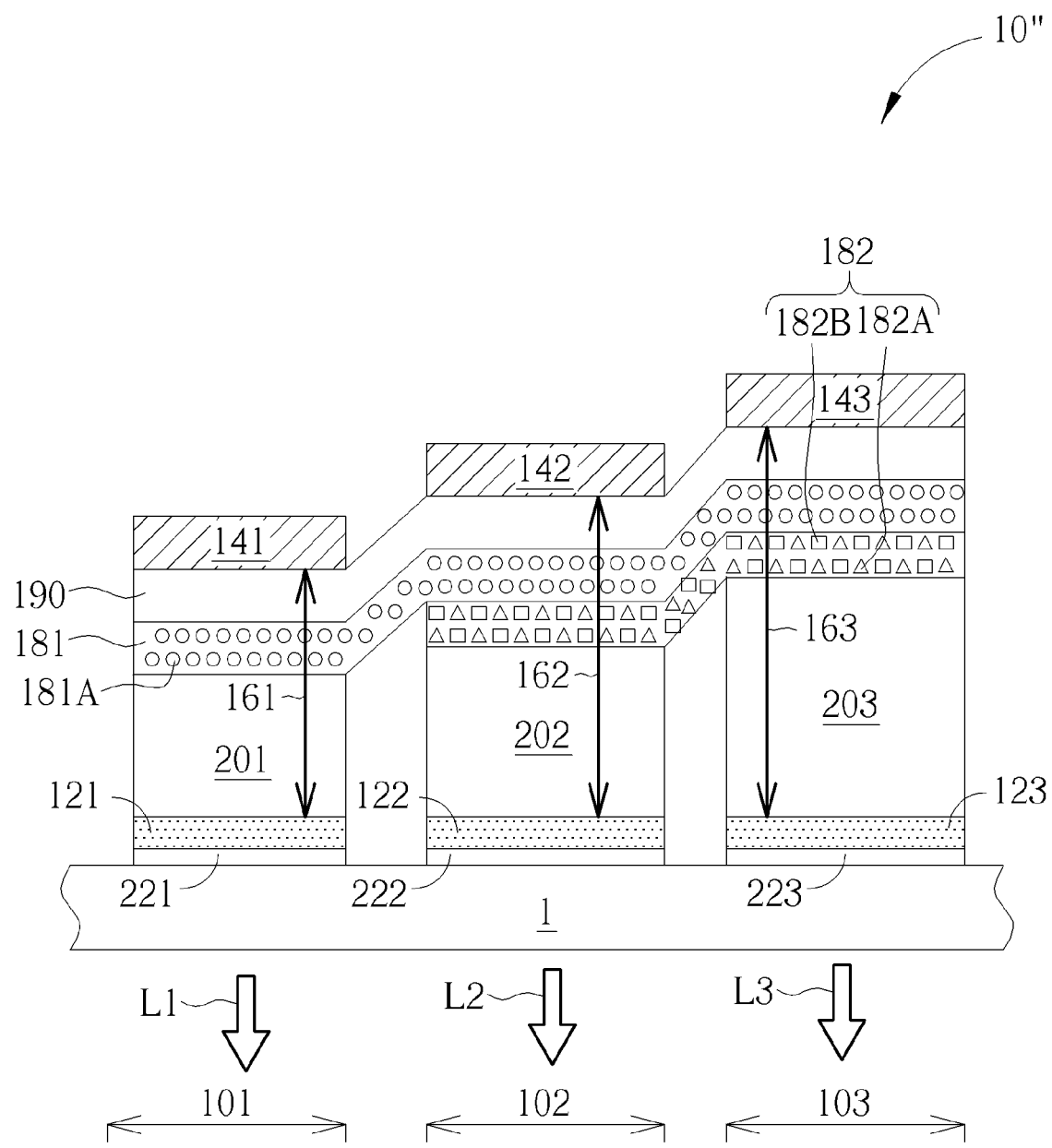
FIG. 3 is a schematic diagram of a pixel structure of an electroluminescent display panel according to a second variant embodiment of the first preferable embodiment of the present invention.

Please refer to FIG. 3. FIG. 3 is a schematic diagram of a pixel structure of an electroluminescent display panel according to a second variant embodiment of the first preferable embodiment of the present invention. As shown in FIG. 3, in the second variant embodiment, the electroluminescent display panel is a bottom emission type electroluminescent display panel. The first anode 121, the second anode 122 and the third anode 123 in the pixel structure 10" of the electroluminescent display panel are transflective electrodes respectively, and the first cathode 141, the second cathode 142 and the third cathode 143 are reflective electrodes respectively. In this embodiment, the first transparent electrode layer 221 is disposed between the substrate 1 and the first anode 121, the second transparent electrode layer 222 is disposed between the substrate 1 and the second anode 122, and the third transparent electrode layer 223 is disposed between the substrate 1 and the third anode 123. In this embodiment, the first transparent electrode layer 221, the second transparent electrode layer 222 and the third transparent electrode layer 223 have substantially the same thicknesses, and the first micro cavity 161, the second micro cavity 162 and the third micro cavity 163 having different cavity lengths is achieved by enabling the first hole transport layer 201, the second hole transport layer 202 and the third hole transport layer 203 to have different thicknesses, but not limited thereto.

Figure 4:
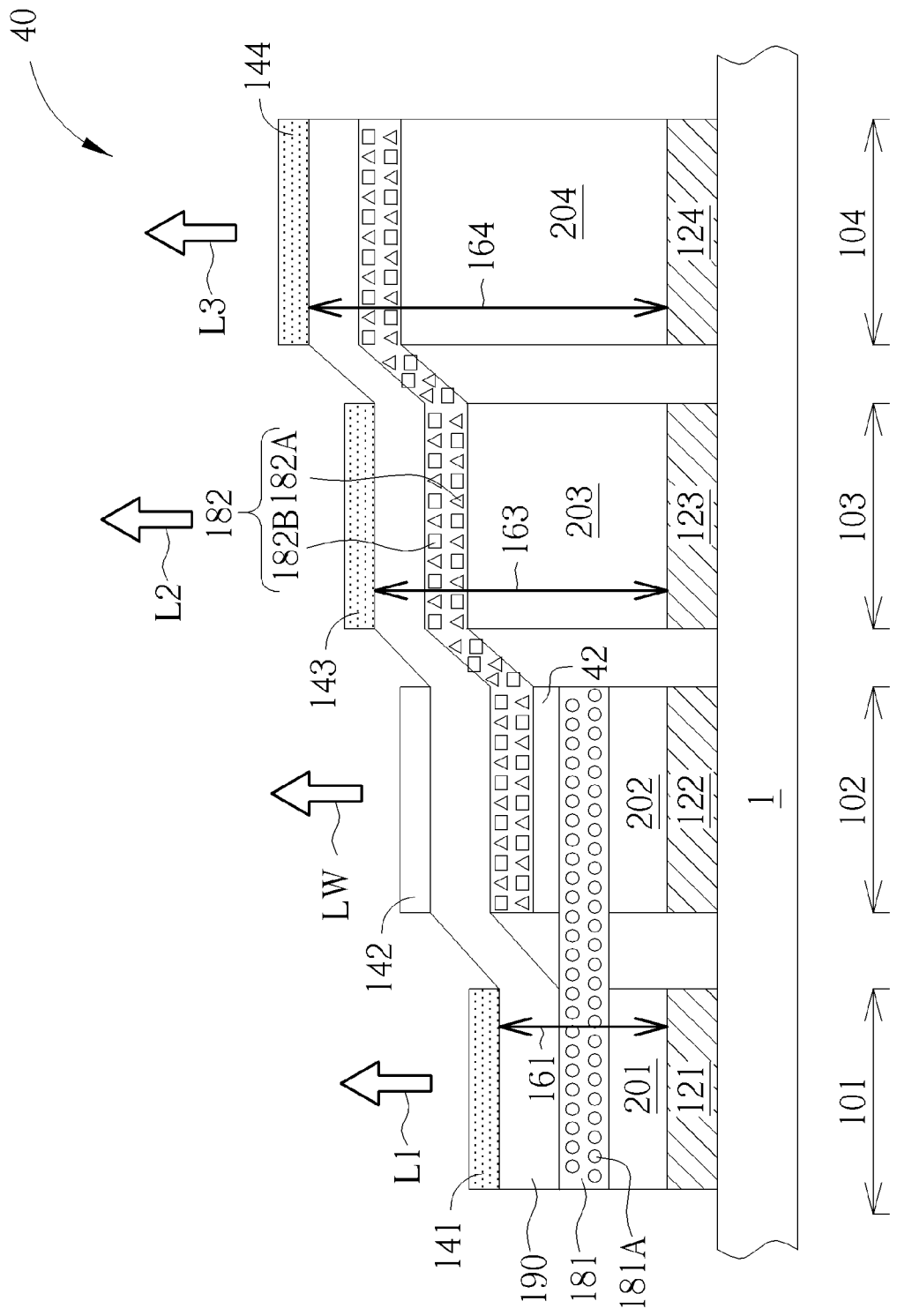
FIG. 4 is a schematic diagram of a pixel structure of an electroluminescent display panel according to a second preferable embodiment of the present invention.

Please refer to FIG. 4. FIG. 4 is a schematic diagram of a pixel structure of an electroluminescent display panel according to a second preferable embodiment of the present invention. As shown in FIG. 4, different from the above embodiments, the pixel structure 40 of the electroluminescent display panel of this embodiment has a first sub-pixel region 101, a second sub-pixel region 102, a third sub-pixel region 103 and a fourth sub-pixel region 104, or the pixel structure 40 of the electroluminescent display panel is composed of a first sub-pixel region 101, a second sub-pixel region 102, a third sub-pixel region 103 and a fourth sub-pixel region 104. The first sub-pixel region 101, the third sub-pixel region 103 and the fourth sub-pixel region 104 are used for providing different color lights, such as a first primary color light L1, a second primary color light L2 and a third primary color light L3, respectively, and the second sub-pixel region 102 is used for providing a white light LW. The pixel structure 40 of the electroluminescent display panel further includes a fourth anode 124, a fourth cathode 144 and at least one fourth hole transport layer 204 disposed in the fourth sub-pixel region 104, and a fourth micro cavity 164 is formed between the fourth anode 124 and the fourth cathode 144. The first micro cavity 161, the third micro cavity 163 and the fourth micro cavity 164 have different cavity lengths. In this embodiment, the first organic light-emitting layer 181 is disposed in the first sub-pixel region 101 and the second sub-pixel region 102, the second organic light-emitting layer 182 is disposed in the second sub-pixel region 102, the third sub-pixel region 103 and the fourth sub-pixel region 104, and the first organic light-emitting layer 181 and the second organic light-emitting layer 182 are overlapped with each other in the second sub-pixel region 102. In this embodiment, the second organic light-emitting layer 182 is stacked on the first organic light-emitting layer 181, but not limited thereto. In other embodiments, the first organic light-emitting layer 181 may be stacked on the second organic light-emitting layer 182. In addition, the pixel structure 40 of the electroluminescent display panel may further selectively include a charge generation layer 42, disposed between the first organic light-emitting layer 181 and the second organic light-emitting layer 182 in the second sub-pixel region 102. The electroluminescent display panel of this embodiment is a top emission type electroluminescent display panel, and the second cathode 142 is a transmissive electrode, not a transflective electrode. Therefore, in the second sub-pixel region 102, no micro cavity will be formed. In such situation, since the first organic light-emitting layer 181 and the second organic light-emitting layer 182 are overlapped in the second sub-pixel region 102, the first primary color light L1 generated by the first organic light-emitting layer 181 will mix with the second primary color light L2 and the third primary color light L3 generated by the second organic light-emitting layer 182 to produce a white light LW in the second sub-pixel region 102. In another aspect, due to the micro cavity effect, the first primary color light L1 generated by the first organic light-emitting layer 181 will emit out from the first sub-pixel region 101. The second primary color light L2 generated by the second organic light-emitting layer 182 will emit out from the third sub-pixel region 103, but not emit out from the fourth sub-pixel region 104, and the third primary color light L3 will emit out from the fourth sub-pixel region 104, but not emit out from the third sub-pixel region 103. In another words, by making use of the micro cavity effect in the present invention, each sub-pixel region can produce different primary color lights without using color filters.

In this embodiment, that the first micro cavity 161, the third micro cavity 163 and the fourth micro cavity 164 have different cavity lengths is achieved by making the first hole transport layer 201, the third hole transport layer 203 and the fourth hole transport layer 204 have different thicknesses. For example, in this embodiment, the first primary color light L1 is blue light, the second primary color light L2 is green light, and the third primary color light L3 is red light, thus the relation of the cavity lengths is as the following: the cavity length of the fourth micro cavity 164 is greater than the cavity length of the third micro cavity 163, and the cavity length of the third micro cavity 163 is greater than the cavity length of the first micro cavity 161. Accordingly, the thickness of the fourth hole transport layer 204 is greater than the thickness of the third hole transport layer 203 and the thickness of the third hole transport layer 203 is greater than the thickness of the first hole transport layer 201 in this embodiment. The fourth hole transport layer 204, the third hole transport layer 203, the second hole transport layer 202 and the first hole transport layer 201 may have the same carrier mobility, but not limited thereto. Besides, the pixel structure 40 of the electroluminescent display panel of this embodiment may not include any transparent electrode layer in the first sub-pixel region 101, the second sub-pixel region 102, the third sub-pixel region 103 and the fourth sub-pixel region 104. However, the transparent electrode layers may also be included in the sub-pixel regions in another embodiment.

From the above description, only two organic light-emitting layers are used to form the pixel structure of electroluminescent display panel which has three different primary-color sub-pixels (such as red sub-pixel, green sub-pixel and blue sub-pixel) and one white sub-pixel arranged side by side without any color filter in this embodiment, resulting in effectively reducing the power consumption.

Figure 5:
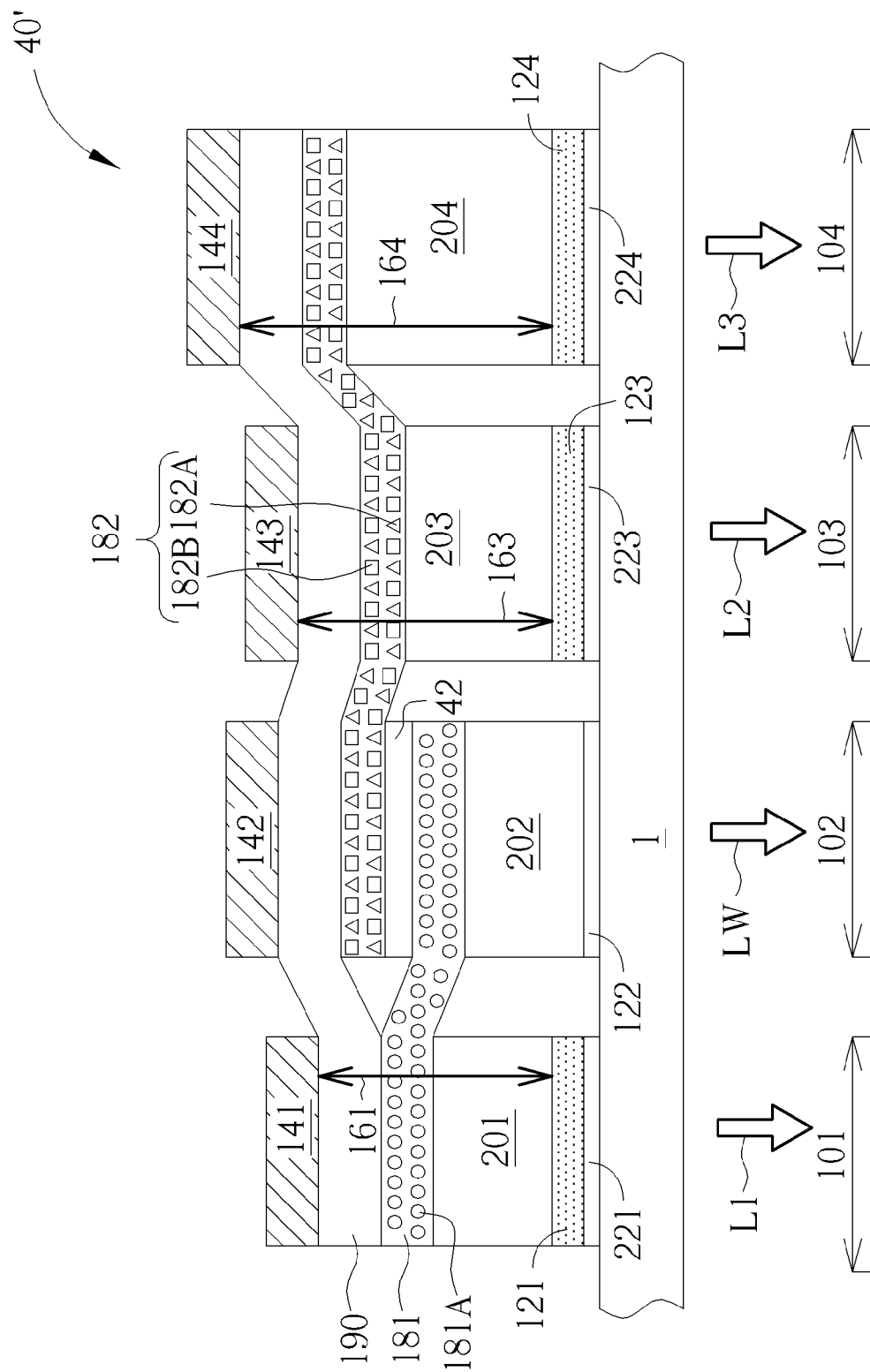
FIG. 5 is a schematic diagram of a pixel structure of an electroluminescent display panel according to a first variant embodiment of the second preferable embodiment of the present invention.

Please refer to FIG. 5. FIG. 5 is a schematic diagram of a pixel structure of an electroluminescent display panel according to a first variant embodiment of the second preferable embodiment of the present invention. As shown in FIG. 5, different from the above embodiment, the electroluminescent display panel in the first variant embodiment is a bottom emission type electroluminescent display panel. The first anode 121, the third anode 123 and the fourth anode 124 of the pixel structure 40' of the electroluminescent display panel of the first variant embodiment are transflective electrodes, the second anode 122 is a transmissive electrode, and the first cathode 141, the second cathode 142, the third cathode 143 and the fourth cathode 144 are reflective electrodes. In addition, the pixel structure 40' of the electroluminescent display panel may further comprise at least one first transparent electrode layer 221, at least one third transparent electrode layer 223 and at least one fourth transparent electrode layer 224. The first transparent electrode layer 221 is disposed between the substrate 1 and the first anode 121 in the first sub-pixel region 101, the third transparent electrode layer 223 is disposed between the substrate 1 and the third anode 123 in the third sub-pixel region 103, and the fourth transparent electrode layer 224 is disposed between the substrate 1 and the fourth anode 124 in the fourth sub-pixel region 104. It is noteworthy that the second anode 122 of the second sub-pixel region 102 of the pixel structure 40' of the electroluminescent display panel is a transmissive electrode, not a transflective electrode, thus no micro cavity effect will occur in the second sub-pixel region 102 such that the second sub-pixel region 102 can display white light.

Figure 6:
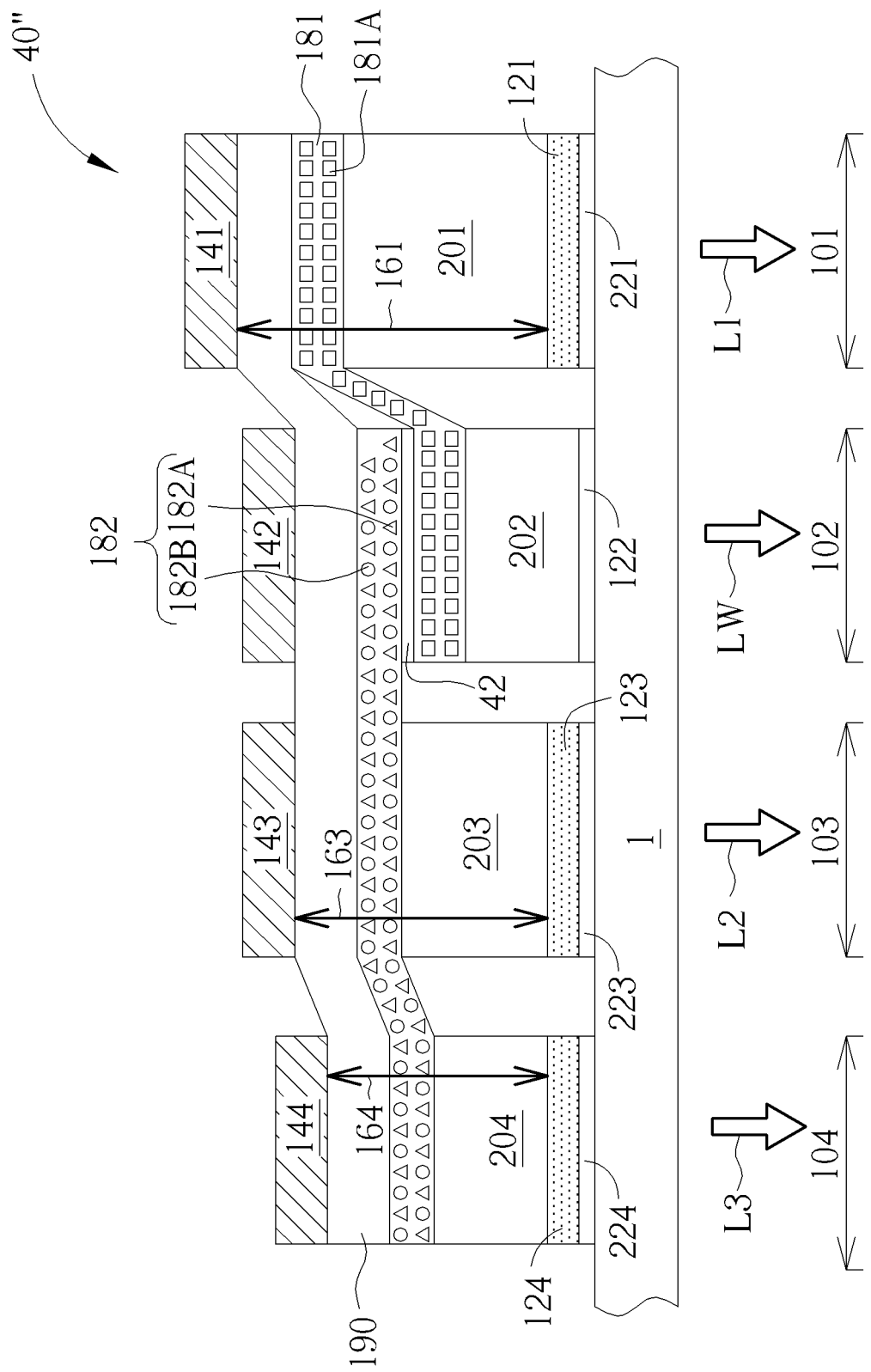
FIG. 6 is a schematic diagram of a pixel structure of an electroluminescent display panel according to a second variant embodiment of the second preferable embodiment of the present invention.

Please refer to FIG. 6. FIG. 6 is a schematic diagram of a pixel structure of an electroluminescent display panel according to a second variant embodiment of the second preferable embodiment of the present invention. As shown in FIG. 6, in this second variant embodiment, the electroluminescent display panel is a bottom emission type electroluminescent display panel. In the pixel structure 40'' of the electroluminescent display panel, the first organic light-emitting material 181A of the first organic light-emitting layer 181 is a red light organic light-emitting material, the second organic light-emitting material 182A of the second organic light-emitting layer 182 is a green light organic light-emitting material, and the third organic light-emitting material 182B of the second organic light-emitting layer 182 is a blue light organic light-emitting material. Accordingly, in the second sub-pixel region 102, the first primary color light L1 generated by the first organic light-emitting layer 181 mixes with the second primary color light L2 and the third primary color light L3 generated by the second organic light-emitting layer 182 to produce a white light LW. In another aspect, due to the micro cavity effect, the first primary color light (red light) L1 generated by the first organic light-emitting layer 181 will emit out from the first sub-pixel region 101. The second primary color light (green light) L2 generated by the second organic light-emitting layer 182 will emit out from the third sub-pixel region 103 but not from the fourth sub-pixel region 104, and the third primary color light (blue light) L3 will emit out only from the fourth sub-pixel region 104 but not from the third sub-pixel region 103. In other words, the micro cavity effect is utilized in the present invention to enable each sub-pixel region to produce different primary color lights while no color filter is used. Besides, in this embodiment, the first transparent electrode layer 221, the third transparent electrode layer 223 and the fourth transparent electrode layer 224 have substantially the same thicknesses, and that the first micro cavity 161, the third micro cavity 163 and the fourth micro cavity 164 have different cavity lengths is achieved by making the first hole transport layer 201, the third hole transport layer 203 and the fourth hole transport layer 204 having different thicknesses, but not limited thereto.

Figure 7:
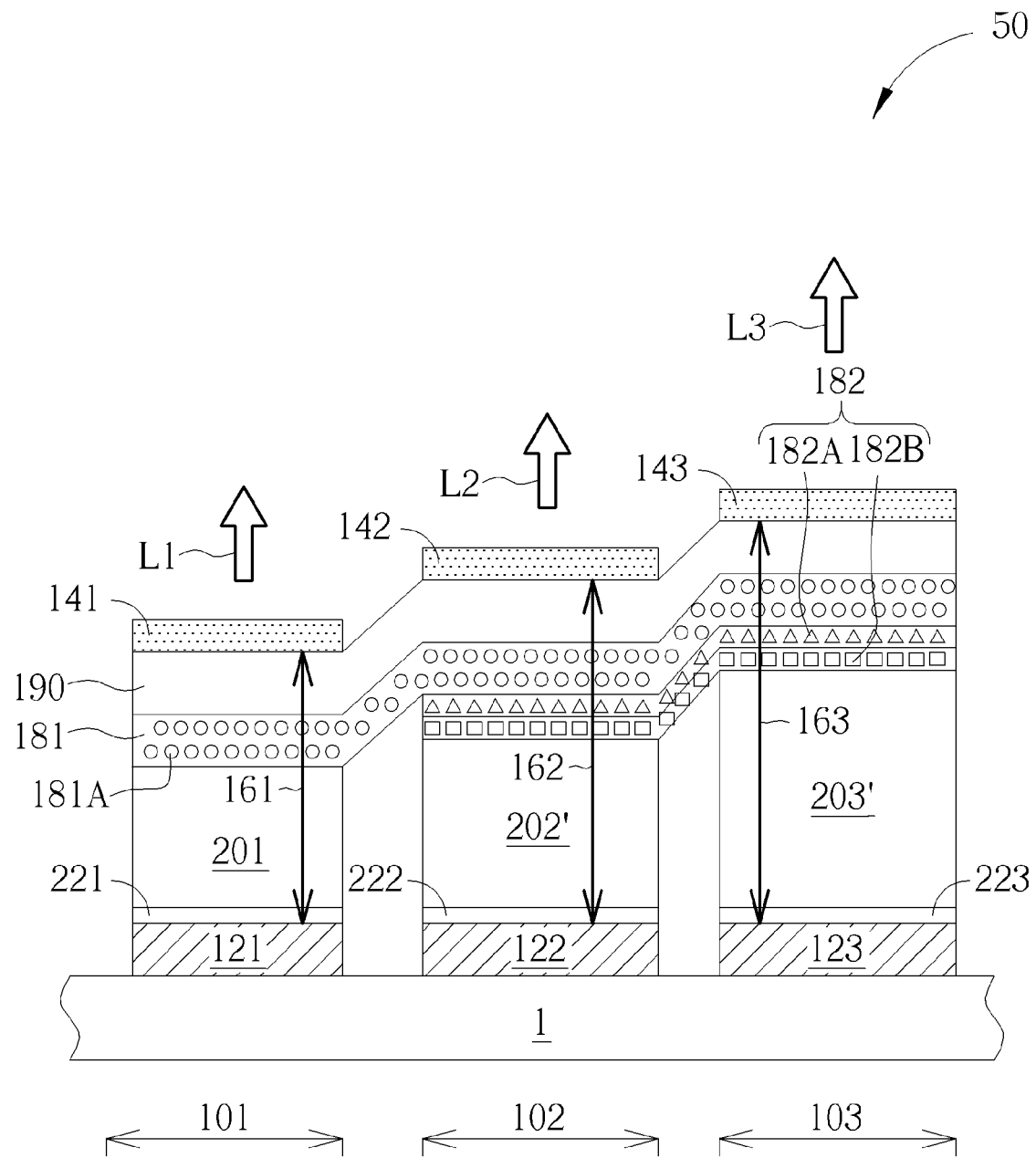
FIG. 7 is a schematic diagram of a pixel structure of an electroluminescent display panel according to a third preferable embodiment of the present invention.

Please refer to FIG. 7. FIG. 7 is a schematic diagram of a pixel structure of an electroluminescent display panel according to a third preferable embodiment of the present invention. As shown in FIG. 7, different from the first preferable embodiment, the carrier mobility of the third hole transport layer 203' is different from the carrier mobility of the second hole transport layer 202' in the pixel structure 50 of the electroluminescent display panel of this embodiment. Accurately, in this embodiment, the carrier mobility of the third hole transport layer 203' is less than the carrier mobility of the second hole transport layer 202'. For example, the carrier mobility of the third hole transport layer 203' may be substantially between $10^{-4}$ cm$^2$/Vs and $10^{-6}$ cm$^2$/Vs, and the carrier mobility of the second hole transport layer 202' may be substantially greater than $10^{-4}$ cm$^2$/Vs. The third hole transport layer 203' may be a single-layered hole transport layer, wherein the single-layered hole transport layer may be composed of one single material, and the carrier mobility of the material is less than the carrier mobility of the material used to form the second hole transport layer 202'. However, the single-layered hole transport layer forming the third hole transport layer 203' may also be composed of a mixture of two or more materials with different transport properties. For example, the third hole transport layer 203' may include a mixture of a hole transport material with low carrier mobility and a hole transport material with high carrier mobility, and the mixture of the above mentioned materials has a carrier mobility less than that of the material composed of second hole transport layer 202'. The second organic light-emitting layer 182 includes a composite-layered organic light-emitting layer, including a second organic light-emitting material 182A and a third organic light-emitting material 182B, one stacked on another, wherein the third organic light-emitting material 182B is disposed between the second organic light-emitting material 182A and the third hole transport layer 203', and the second organic light-emitting material 182A is disposed between the first organic light-emitting layer 181 and the third organic light-emitting material 182B, that is to say, the third organic light-emitting material 182B is closer to the second hole transport layer 202' and the third hole transport layer 203' than the second organic light-emitting material 182A. In addition, the wavelength of the third primary color light L3 is greater than that of the second primary color light L2, and the wavelength of the second primary color light L2 is greater than that of the first primary color light L1. For example, the first organic light-emitting material 181 is a blue light organic light-emitting material, the second organic light-emitting material 182A is a green light organic light-emitting material, and the third organic light-emitting material 182B is a red light organic light-emitting material; in other words, the first primary color light L1 is blue light, the second primary color light L2 is green light, and the third primary color light L3 is red light.

Figure 8:
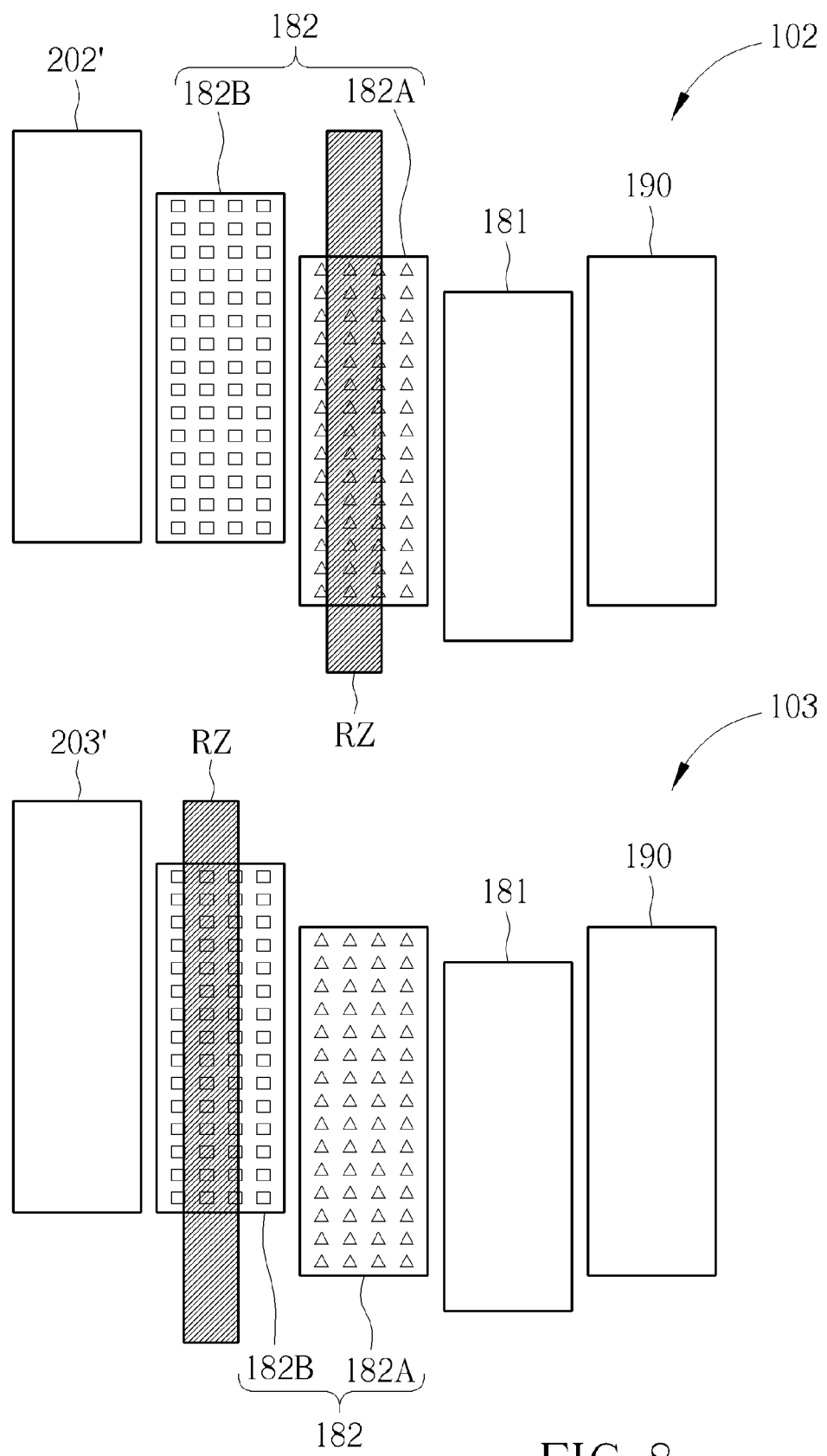
FIG. 8 is a schematic diagram showing the location of the recombination zone of the second sub-pixel region and the third sub-pixel region of the pixel structure of the electroluminescent display panel according to the third preferable embodiment of the present invention.

Please refer to FIG. 8, wherein FIG. 8 illustrates the location of the recombination zone of electrons and holes of the second sub-pixel region and the third sub-pixel region of the pixel structure of the electroluminescent display panel of the third preferable embodiment shown in FIG. 7. As shown in FIG. 8, since the carrier mobility of the third hole transport layer 203' is less than the carrier mobility of the second hole transport layer 202', the recombination zone RZ of electrons and holes in the third sub-pixel region 103 is located in the third organic light-emitting material 182B that is close to the third hole transport layer 203', and the recombination zone RZ of electrons and holes in the second sub-pixel region 102 is disposed in the second organic light-emitting material 182A that is distant from the second hole transport layer 202'.

From the above description, addition to the micro cavity effect, this embodiment further provides a method to modify the positions of the recombination zones of the third sub-pixel region 103 and the second sub-pixel region 102 by adjusting individual carrier mobility of the third hole transport layer 203' and the second hole transport layer 202'. By modifying the positions of the recombination zones, it can be assured that only the third primary color light L3 will be emitted out from the third sub-pixel region 103 in a great viewing angle and only the second primary color light L2 will be emitted out from the second sub-pixel region 102 in a great viewing-angle. Accordingly, color shift will not occur whatever a user is viewing the electroluminescent display panel in a large view angle or right in front of the electroluminescent display panel.

Figure 9:
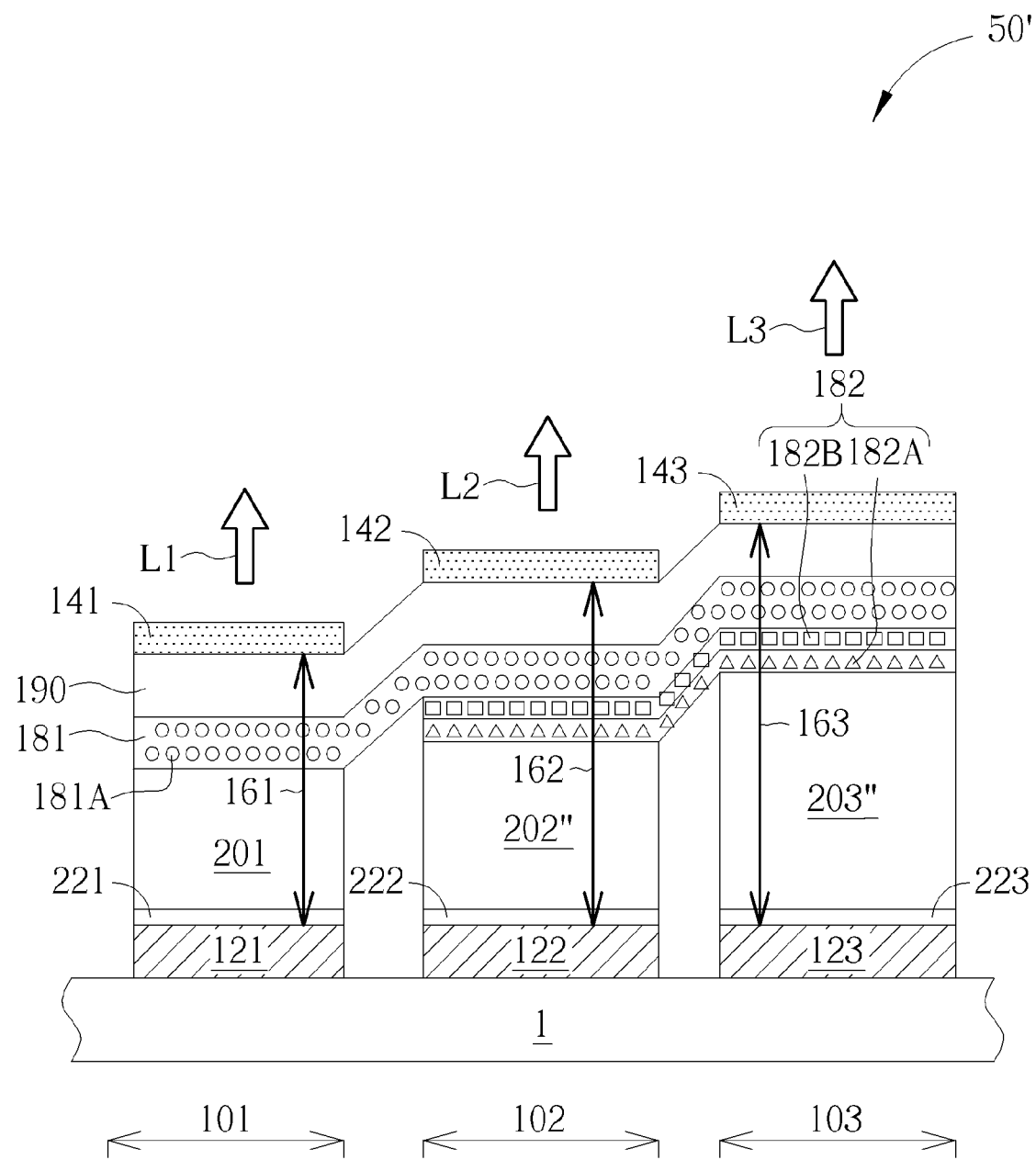
FIG. 9 is a schematic diagram of a pixel structure of an electroluminescent display panel according to a first variant embodiment of the third preferable embodiment of the present invention.

Please refer to FIG. 9. FIG. 9 is a schematic diagram of a pixel structure of an electroluminescent display panel according to a first variant embodiment of the third preferable embodiment of the present invention. As shown in FIG. 9, different from the third preferable embodiment, the carrier mobility of the third hole transport layer 203" is greater than that of the second hole transport layer 202" in the pixel structure 50' of the electroluminescent display panel of the first variant embodiment. For example, the carrier mobility of the third hole transport layer 203" may be substantially greater than about $10^{-4}$ cm$^2$/Vs, and the carrier mobility of the second hole transport layer 202" is substantially between about $10^{-4}$ cm$^2$/Vs and $10^{-6}$ cm$^2$/Vs. The third hole transport layer 203" may be a single-layered hole transport layer, wherein the single-layered hole transport layer may be composed of a one single material, and the carrier mobility of the material is greater than the carrier mobility of the material used in the second hole transport layer 202". However, the single-layered hole transport layer composing the third hole transport layer 203" may also include a mixture of two or more materials with different transport properties. For instance, the third hole transport layer 203" may include a mixture of a hole transport material with low carrier mobility and a hole transport material with high carrier mobility, and the carrier mobility of the mixture of the above-mentioned materials is greater than the carrier mobility of the material used in the second hole transport layer 202". In addition, the second organic light-emitting material 182A is disposed between the third organic light-emitting material 182B and the third hole transport layer 203", and the third organic light-emitting material 182B is disposed between the first organic light-emitting layer 181 and the second organic light-emitting material 182A, that is to say, the second organic light-emitting material 182A is closer to the second hole transport layer 202" and the third hole transport layer 203" than the third organic light-emitting material 182B. In such situation, the recombination zone of electrons and holes in the third sub-pixel region 103 is located in the third organic light-emitting material 182B that is distant from the third hole transport layer 203", and the recombination zone of electrons and holes in the second sub-pixel region 102 is located in the second organic light-emitting material 182A that is close to the second hole transport layer 202".

Figure 10:
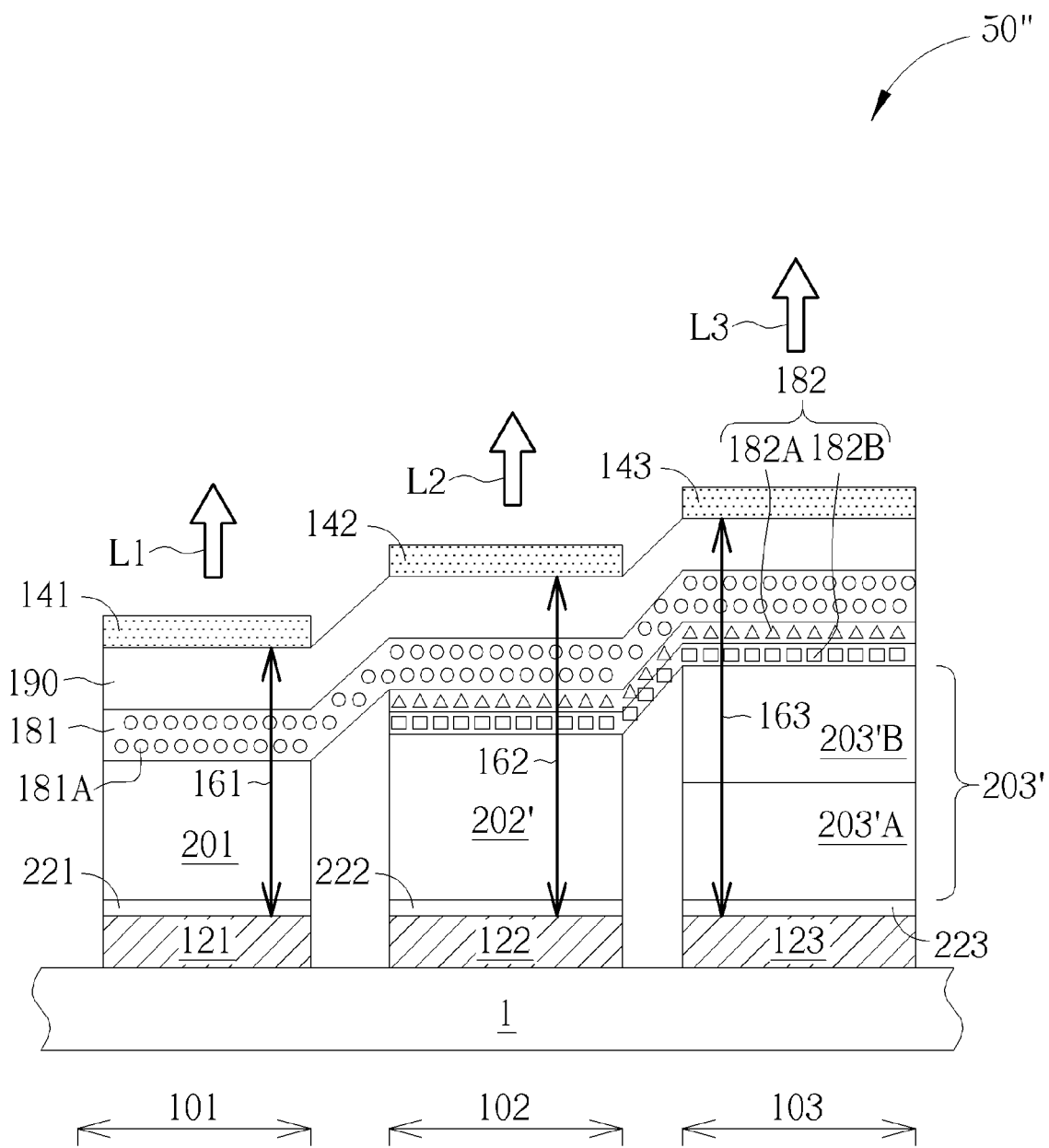
FIG. 10 is a schematic diagram of a pixel structure of an electroluminescent display panel according to a second variant embodiment of the third preferable embodiment of the present invention.

Please refer to FIG. 10. FIG. 10 is a schematic diagram of a pixel structure of an electroluminescent display panel according to a second variant embodiment of the third preferable embodiment of the present invention. As shown in FIG. 10, different from the third preferable embodiment, in the pixel structure 50 of the electroluminescent display panel" of the second variant embodiment, the third hole transport layer 203' is a composite-layered hole transport layer, which may include a low-carrier-mobility hole transport layer 203'A and a high-carrier-mobility hole transport layer 203'B, one stacked on another, for instance. Wherein, the carrier mobility of the whole third hole transport layer 203' is less than the carrier mobility of the second hole transport layer 202'. For example, the carrier mobility of the whole third hole transport layer 203' is substantially between about $10^{-4}$ $cm^2/Vs$ to $10^{-6}$ $cm^2/Vs$, wherein the carrier mobility of the low-carrier-mobility hole transport layer 203'A is substantially between about $10^{-4}$ $cm^2/Vs$ to $10^{-6}$ $cm^2/Vs$, and the carrier mobility of the high-carrier-mobility hole transport layer 203'B is substantially greater than about $10^{-4}$ $cm^2/Vs$, and the carrier mobility of the second hole transport layer 202' is substantially greater than about $10^{-4}$ $cm^2/Vs$. In this embodiment, the high-carrier-mobility hole transport layer 203'B may be stacked on the low-carrier-mobility hole transport layer 203'A, but not limited thereto. For instance, the low-carrier-mobility hole transport layer 203'A may also be stacked on the high-carrier-mobility hole transport layer 203'B in another embodiment. Preferably, the high-carrier-mobility hole transport layer 203'B of the third hole transport layer 203' and the second hole transport layer 202' may have the same carrier mobility and include the same material, thus the high-carrier-mobility hole transport layer 203'B and the second hole transport layer 202' can be formed together through a same formation step so as to economize the whole fabrication processes. In addition, in this embodiment, the low-carrier-mobility hole transport layer 203'A and the high-carrier-mobility hole transport layer 203'B may be formed with one single material or with a mixture of two or more materials with different transport properties, individually. The third organic light-emitting material 182B is disposed between the second organic light-emitting material 182A and the third hole transport layer 203', and the second organic light-emitting material 182A is disposed between the first organic light-emitting layer 181 and the third organic light-emitting material 182B. In such situation, the recombination zone RZ of electrons and holes in the third sub-pixel region 103 is located in the third organic light-emitting material 182B that is close to the third hole transport layer 203', and the recombination zone RZ of electrons and holes of the second sub-pixel region 102 is located in the second organic light-emitting material 182A that is distant from the second hole transport layer 202', as shown in FIG. 8.

Figure 11:
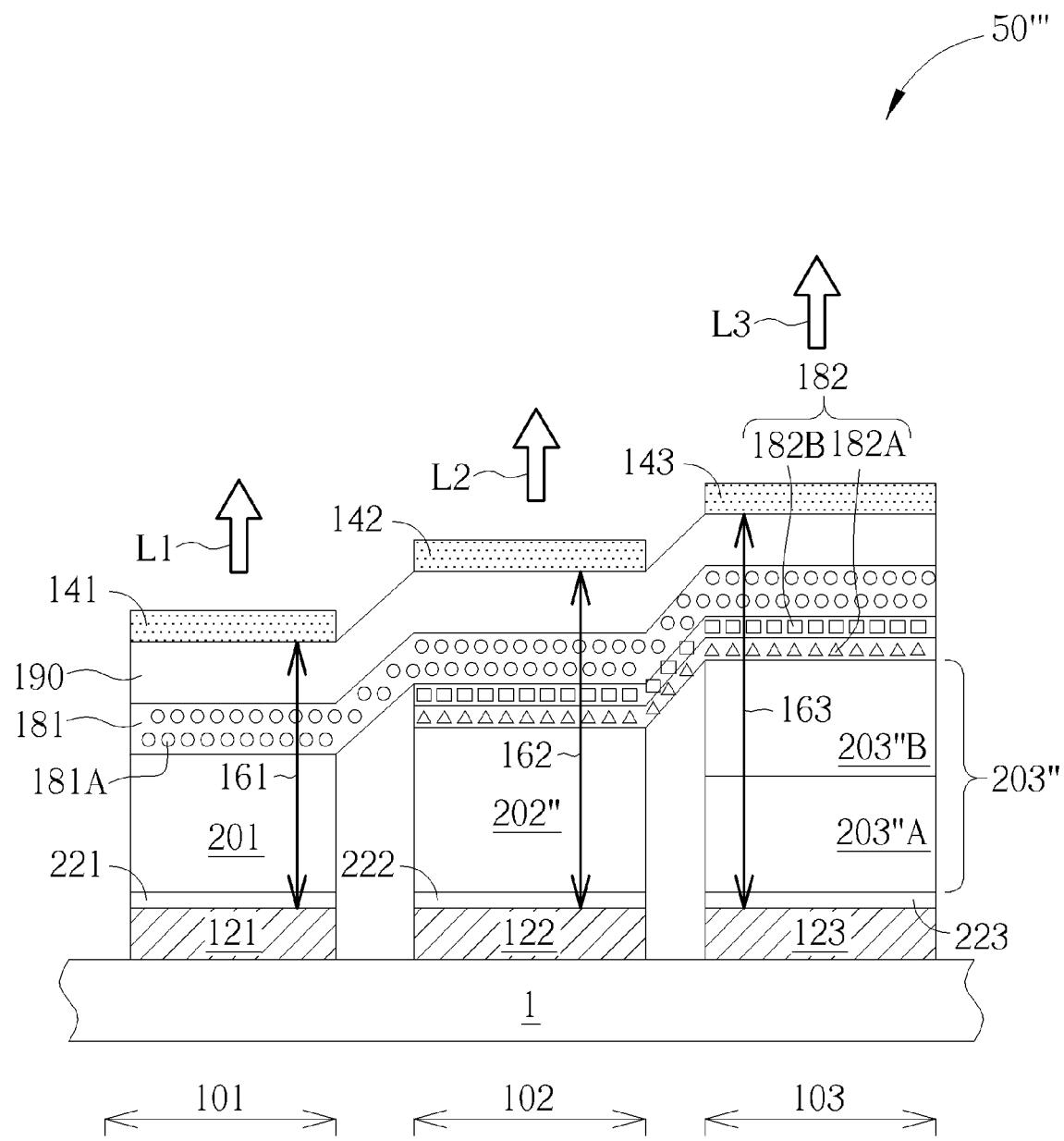
FIG. 11 is a schematic diagram of a pixel structure of an electroluminescent display panel according to a third variant embodiment of the third preferable embodiment of the present invention.

Please refer to FIG. 11. FIG. 11 is a schematic diagram of a pixel structure of an electroluminescent display panel according to a third variant embodiment of the third preferable embodiment of the present invention. As shown in FIG. 11, in the pixel structure 50''' of the electroluminescent display panel of the third variant embodiment, the third hole transport layer 203" is a composite-layered hole transport layer, including a low-carrier-mobility hole transport layer 203"A and a high-carrier-mobility hole transport layer 203"B, one stacked on another. Different from the second variant embodiment of the third preferable embodiment, the carrier mobility of the whole third hole transport layer 203" of this embodiment is greater than that of the second hole transport layer 202". For example, the carrier mobility of the third hole transport layer 203" is substantially between about $10^{-4}$ $cm^2/Vs$ and $10^{-6}$ $cm^2/Vs$, wherein the carrier mobility of the low-carrier-mobility hole transport layer 203"A is substantially between about $10^{-4}$ $cm^2/Vs$ and $10^{-6}$ $cm^2/Vs$, and the carrier mobility of the high-carrier-mobility hole transport layer 203"B is substantially greater than about $10^{-4}$ $cm^2/Vs$. The carrier mobility of the second hole transport layer 202" is substantially between about $10^{-4}$ $cm^2/Vs$ and $10^{-6}$ $cm^2/Vs$. Preferably, the low-carrier-mobility hole transport layer 203"A of the third hole transport layer 203" and the second hole transport layer 202" may have the same carrier mobility and include the same material, thus the low-carrier-mobility hole transport layer 203"A and the second hole transport layer 202" may be formed through a same formation step, so as to economize the whole fabrication processes. In this embodiment, the low-carrier-mobility hole transport layer 203"A and the high-carrier-mobility hole transport layer 203"B may be formed with one single material or with a mixture of two or more materials with different transport properties, individually. In addition, the second organic light-emitting material 182A is located between the third organic light-emitting material 182B and the third hole transport layer 203", and the third organic light-emitting material 182B is located between the first organic light-emitting layer 181 and the second organic light-emitting material 182A. In such situation, the recombination zone of electrons and holes in the third sub-pixel region 103 is located in the third organic light-emitting material 182B that is distant from the third hole transport layer 203", and the recombination zone of electrons and holes in the second sub-pixel region 102 is located in the second organic light-emitting material 182A that is close to the second hole transport layer 202". Furthermore, in other variant embodiments, the third hole transport layer 203" may be composed of two or more hole transport layers with different carrier mobility.

In conclusion, by making use of micro cavity effect in the pixel structure of the electroluminescent display panel of the present invention, only two organic light-emitting layers are needed to form sub-pixels with three different primary colors (red sub-pixel, green sub-pixel and blue sub-pixel) or form sub-pixels with three different primary colors (red sub-pixel, green sub-pixel and blue sub-pixel) and one white sub-pixel, without using any color filter, so as to effectively improve the color saturation and reduce power consumption. In addition, according to the present invention, by adjusting the carrier mobility of the hole transport layers of the pixel structure of electroluminescent display panel, the color shift can be prevented in large viewing angles.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A pixel structure of an electroluminescent display panel, having a first sub-pixel region, a second sub-pixel region and a third sub-pixel region, the first sub-pixel region, the second sub-pixel region and the third sub-pixel region being used for providing a first primary color light, a second primary color light and a third primary color light respectively, the pixel structure of the electroluminescent display panel comprising:
   a first anode, disposed in the first sub-pixel region;
   a second anode, disposed in the second sub-pixel region;
   a third anode, disposed in the third sub-pixel region;
   a first organic light-emitting layer, disposed at least in the first sub-pixel region, the second sub-pixel region and the third sub-pixel region, wherein the first organic light-emitting layer comprises a first organic light-emitting material;
   a second organic light-emitting layer, disposed at least in the second sub-pixel region and the third sub-pixel region, wherein the first organic light-emitting layer overlaps the second organic light-emitting layer in the second sub-pixel region, and the second organic light-emitting layer comprise a second organic light-emitting material and a third organic light-emitting material;
   a first cathode, disposed in the first sub-pixel region;
   a second cathode, disposed in the second sub-pixel region;
   a third cathode, disposed in the third sub-pixel region;
   at least one first hole transport layer, disposed in the first sub-pixel region;
   at least one second hole transport layer, disposed in the second sub-pixel region; and
   at least one third hole transport layer, disposed in the third sub-pixel region, wherein the at least one third hole transport layer comprises a single-layered hole transport layer, and the single-layered hole transport layer comprises a mixture of a hole transmission material with a low carrier mobility and a hole transmission material with a high carrier mobility;
   wherein a first micro cavity is formed between the first anode and the first cathode in the first sub-pixel region, a second micro cavity is formed between the second anode and the second cathode in the second sub-pixel region, a third micro cavity is formed between the third anode and the third cathode in the third sub-pixel region, and the at least one first hole transport layer, the at least one second hole transport layer and the at least one third hole transport layer have different thicknesses to render the first micro cavity, the second micro cavity and the third micro cavity having different cavity lengths, and
   wherein a wavelength of the third primary color light is greater than a wavelength of the second primary color light, the wavelength of the second primary color light is greater than a wavelength of the first primary color light, and a carrier mobility of the third hole transport layer is different from a carrier mobility of the second hole transport layer.

2. The pixel structure of the electroluminescent display panel of claim 1, wherein the first organic light-emitting layer is a structural layer continuously disposed in the first sub-pixel region, the second sub-pixel region and the third sub-pixel region, the second organic light-emitting layer is a structural layer continuously disposed in the second sub-pixel region and the third sub-pixel region, and the first organic light-emitting layer overlaps the second organic light-emitting layer in the second sub-pixel region and the third sub-pixel region.

3. The pixel structure of the electroluminescent display panel of claim 1, wherein the third organic light-emitting material of the second organic light-emitting layer is disposed between the second organic light-emitting material and the third hole transport layer, and the carrier mobility of the third hole transport layer is less than the carrier mobility of the second hole transport layer.

4. The pixel structure of the electroluminescent display panel of claim 1, wherein the second organic light-emitting material of the second organic light-emitting layer is disposed between the third organic light-emitting material and the third hole transport layer, and the carrier mobility of the third hole transport layer is greater than the carrier mobility of the second hole transport layer.

5. The pixel structure of the electroluminescent display panel of claim 1, wherein the first organic light-emitting material is a blue light organic light-emitting material, the second organic light-emitting material is a green light organic light-emitting material, and the third organic light-emitting material is a red light organic light-emitting material.

6. The pixel structure of the electroluminescent display panel of claim 1, wherein the electroluminescent display panel is a top emission type electroluminescent display panel, each of the first cathode, the second cathode and the third cathode comprises a transflective electrode, and each of the first anode, the second anode and the third anode comprises a reflective electrode.

7. The pixel structure of the electroluminescent display panel of claim 1, wherein the electroluminescent display panel is a bottom emission type electroluminescent display panel, each of the first anode, the second anode and the third anode comprises a transflective electrode, and each of the first cathode, the second cathode and the third cathode comprises a reflective electrode.

8. The pixel structure of the electroluminescent display panel of claim 1, wherein the first organic light-emitting material is a blue light organic light-emitting material, and the second organic light-emitting material and the third organic light-emitting material are a green light organic light-emitting material and a red light organic light-emitting material respectively.

* * * * *